(12) United States Patent
Kashkoush et al.

(10) Patent No.: US 6,840,250 B2
(45) Date of Patent: Jan. 11, 2005

(54) NEXTGEN WET PROCESS TANK

(75) Inventors: Ismail Kashkoush, Orefield, PA (US);
Richard Novak, Plymouth, MN (US);
Tom Mancuso, Allentown, PA (US);
Jim Vadimsky, New Tripoli, PA (US)

(73) Assignee: Akrion LLC, Allentown, PA (US)

(*) Notice: Subject to any disclaimer, the term of this patent is extended or adjusted under 35 U.S.C. 154(b) by 482 days.

(21) Appl. No.: 10/117,778

(22) Filed: Apr. 5, 2002

(65) Prior Publication Data

US 2002/0144709 A1 Oct. 10, 2002

Related U.S. Application Data

(60) Provisional application No. 60/282,383, filed on Apr. 6, 2001.

(51) Int. Cl.⁷ ................................................ B08B 7/04
(52) U.S. Cl. ........................ 134/1.3; 134/902; 134/113; 134/186; 134/200; 134/10; 134/2; 134/34
(58) Field of Search ................................ 134/902, 113, 134/186, 200, 184, 102.3, 1, 1.3, 2, 3, 10, 18, 34

(56) References Cited

U.S. PATENT DOCUMENTS

| | | | |
|---|---|---|---|
| 5,776,296 A | | 7/1998 | Matthews |
| 5,921,257 A | * | 7/1999 | Weber et al. ................ 134/186 |
| 5,996,595 A | | 12/1999 | Olesen et al. |
| 6,021,791 A | | 2/2000 | Dryer et al. |
| 6,148,833 A | | 11/2000 | Tang et al. |
| 6,189,552 B1 | * | 2/2001 | Oshinowo ................... 134/201 |
| 6,607,604 B1 | * | 8/2003 | Oshinowo ...................... 134/1 |

* cited by examiner

Primary Examiner—Alexander Markoff
(74) Attorney, Agent, or Firm—Cozen O'Connor, P.C.; Michael B. Fein, Esq.; Brian L. Belles, Esq.

(57) ABSTRACT

A process tank for processing a plurality of wafers having a diameter, the process tank comprising: two substantially vertical side walls being a first distance apart; wherein the first distance is substantially equal to the diameter of the wafer; two upwardly angled walls positioned between the side walls; a first transducer array coupled to a first of the upwardly angled walls, the first transducer array extending a length less than the diameter of the wafer; and a second transducer array coupled to a second of the upwardly angled walls, the second transducer array extending a length less than the diameter of the wafer. It is preferred that the process tank further comprise a fluid inlet positioned between the upwardly angled walls. In another aspect, the invention is a method of processing wafers comprising: filling the process tank described above with a wafer processing liquid through the tank inlet; submerging a wafer carrier holding a plurality wafers into the tank; and applying megasonic energy to the liquid through the first and second transducer arrays for a predetermined time and in a predetermined pattern.

24 Claims, 5 Drawing Sheets

NEXTGEN WET PROCESS TANK

CROSS-REFERENCE TO RELATED APPLICATION

The benefit of Provisional Application 60/282,383, filed Apr. 6, 2001, is claimed.

BACKGROUND OF THE INVENTION

This invention relates generally to the field of manufacturing integrated circuits and specifically to process tanks employing megasonic energy.

In the manufacture of semiconductors, semiconductor devices are produced on thin disk-like objects called wafers. Generally, each wafer contains a plurality of semiconductor devices. The importance of minimizing contaminants on the surface of these wafers during production has been recognized since the beginning of the industry. Moreover, as semiconductor devices become more miniaturized and complex due to end product needs, the cleanliness requirements have become more stringent. This occurs for two reasons.

First, as devices become miniaturized, a contaminating particle on a wafer will occupy a greater percentage of the device's surface area. This increases the likelihood that the device will fail. As such, in order to maintain acceptable output levels of properly functioning devices per wafer, increased cleanliness requirements must be implemented and achieved.

Second, as devices become more complex, the raw materials, time, equipment, and processing steps necessary to make these devices also become more complex and more expensive. As a result, the cost required to make each wafer increases. As such, in order to maintain acceptable levels of profitability, it is imperative to manufacturers that the number of properly functioning devices per wafer be increased. One way to increase this output is to minimize the number of devices that fail due to contamination. Thus, increased cleanliness requirements are desired.

One method by which the industry increases the cleanliness of wafers during processing is by introducing megasonic energy to the surface of the wafers during the cleaning step. In order to utilize megasonic energy in a process tank, the tank is filled with a cleaning solution such as standard clean 1 (SC-1), standard clean 2 (SC-2), deionized water, or a diluted variant of the aforementioned chemicals. SC-1 comprises 1 $NH_4OH$:1 $H_2O_2$:5 $H_2O$. SC-2 comprises 6 $H_2O$:1 $H_2O_2$:1 HCl. Once the tank is filled with the selected fluid, a source of megasonic energy (e.g., a transducer) is coupled to the fluid for producing and directing sonic energy through the fluid to the surfaces of the wafers contained therein. During megasonic cleaning, the transducer will oscillate at a megasonic rate between a negative and a positive position, generating negative and positive pressures within the fluid. As the megasonic energy oscillates, cavitation bubbles form in the fluid during negative pressure and collapse during positive pressure. This formation and collapse of bubbles removes particles from the surface of the wafers contained in the fluid.

While the use of megasonic energy does increase levels of particle removal from the wafer surfaces, prior art process tanks implementing megasonic equipment have a number of drawbacks. Due to the belief that the entire surface of the wafer must be subjected to direct sonic energy emitted from the transducers in order to properly implement megasonic cleaning, existing megasonic tanks utilize transducers whose length is equal to or greater than the diameter of the wafers to be cleaned therein. An example of this type of tank is shown in FIG. 1. As a result of the size and orientation of the transducer arrays 31, 32 in these prior art tanks, the processing chambers are much wider than the diameter of the wafers to be cleaned therein. As such, a space S between the edges of the wafers and the interior of the side walls 34 of the tank is formed. This space is undesirable because fluid in the processing chamber will have a tendency to flow through this space rather than over the surface of the wafers where it is most needed for cleaning purposes. This undesirable flow pattern results because fluid has a tendency to flow through the path of least resistance (i.e. the unobstructed space as compared to between the wafer surfaces where surface friction plays a role). This problem is especially troublesome in process tanks utilizing overflow cleaning.

As a result of the fluid not passing by the surface of the wafers, many particles that would otherwise be removed from the surface of the wafers will remain adhered thereto. Moreover, even those particles that are removed from the wafers will not be carried away from the wafers and out of the processing area. These particles can then re-contact and re-contaminate the wafer surfaces. Thus, despite the use of megasonic energy, these tanks still result in a less than optimal amount of cleaning of the wafer surfaces.

Another problem caused by these spaces arises in the chemical etching step of wafer manufacturing. The increased fluid flow rate in these unobstructed spaces causes non-uniform fluid flow over the wafer surfaces. Specifically, the flow rate of the fluid over the surface of the wafer will be greater near the side edges of the wafer than the flow rate near the center of the wafer. Non-uniform fluid flow of etching chemicals will result in non-uniform etch rates across the surface of the wafers. This in turn will result in an increased number of failed devices.

Moreover, the increased size of the processing chambers of these prior art megasonic tanks also require increased amounts of wafer processing liquid to properly clean the wafers. This increased amount of liquid results not only from the larger volume of liquid needed to fill the tank, but also from the increased liquid needed to properly remove particles form the wafer surface due to the reduced flow between the wafers. As such, the costs associated with operating these process tanks also increases.

While megasonic process tanks do exist whose transducer size and orientation do not automatically necessitate a larger tank, these tanks do not provide optimal cleaning of wafers for a variety of reasons, the foremost being that these tanks have only one transducer centered at the bottom of the processing chamber. An example of one of these tanks is shown in FIG. 2. In these megasonic process tanks, the single transducer 35 is often situated near the center of the bottom of the tank, 36 directly below the wafer stack to be cleaned or etched. When positioned this way, the transducer 35 will obstruct the fluid flow into the processing area, resulting in flow non-uniformity and decreased flow rate over the surface of the wafers.

Additionally, having a single transducer can result in other inadequacies, such as considerable heating during operation. Moreover, the transducer of the process tank shown in FIG. 2 is not in direct contact with the fluid in which the wafer is resting. As such, inadequate sonic energy will be transferred to the liquid and/or increased amounts of electrical energy will be needed to sufficiently clean the wafers.

SUMMARY OF THE INVENTION

It is an object of the present invention to provide a minimally sized megasonic process tank that provides adequate amounts of megasonic cleaning energy to the surfaces of the wafers being processed therein.

Another object of the present invention is to provide a megasonic process tank that can adequately process or clean wafers using a substantially decreased amount of fluids thus reducing the cost of processing wafers.

Yet another object of the present invention is to provide a megasonic process tank that creates a more uniform flow of process liquid over the surfaces of the wafers being processed therein.

Another object of the invention is to provide a process tank that create a uniform fluid flow over the wafer surface such that a uniform etching of dielectric films e.g. $SiO_2$ can be obtained.

Still another object of the present invention is to provide a megasonic process tank that increase particle removal from the surfaces of wafers being processed therein.

Another object of the present invention is to provide a minimally sized megasonic process tank wherein the positioning of the source of megasonic energy does not interfere with the processing of the wafers.

These objects and others are met by the present invention which in one aspect is a process tank for processing a plurality of wafers having a diameter, the process tank comprising two substantially vertical side walls being a first distance apart; wherein the first distance is substantially equal to the diameter of the wafers; two upwardly angled walls positioned between the side walls; a first transducer array coupled to a first of the upwardly angled walls, the first transducer array extending a length less than the diameter of the wafer; and a second transducer array coupled to a second of the upwardly angled walls, the second transducer array extending a length less than the diameter of the wafer.

Preferably, the tank comprises a fluid inlet positioned between the upwardly angled walls, wherein the inlet is approximately one-fourth the diameter of the wafer. It is also preferable that the inlet have an hourglass-shaped side profile and a fluid inlet hole located at or near the bottom of the profile.

It is also preferable that neither the first nor second transducer arrays, individually or in combination with one another, provide direct megasonic energy to the entire surface area of wafers placed in the tank. The lengths of the first and second transducer arrays can be within the range of one-fourth to three-fourths the diameter of the wafers. Preferably, the lengths of the first and second transducer arrays are approximately one-half the diameter of the wafers.

Also preferably, the first and second upwardly angled walls are angled 45 degrees from horizontal. In such an embodiment it is preferable for the lengths of the first and second transducer arrays to be approximately one-half the diameter of the wafers. Moreover, the two upwardly angled walls and the first and second transducer arrays attached thereto can be substantially linear.

It is preferable for the upwardly angled walls to be positioned between the side walls at a height so that when a wafer is uprightly positioned in the tank so that the top of the wafer is just below the top of the side walls, the wafer nearly contacts the first and second transducer surfaces. Preferable, the wafers come within 0.1–1 inch of the first and second transducer surfaces. It is preferable that the tank further comprise a re-circulation weir having at least one quick dump valve.

The first and second transducer arrays can be respectively coupled to the upper surface of the first and second upwardly angled walls. As such, both transducers are in direct contact with the fluid in which the wafers will rest. The first and second transducers can be capable of producing megasonic energy in the frequency range of 0.5 to 20 MHz.

It is preferable for the tank to further comprise a substantially vertical back wall and a substantially vertical front wall, the front and back walls being a second distance apart wherein the second distance is substantially equal to length of a wafer carrier adapted to carry a plurality of wafers. The tank can be adapted for ringing wafers after chemical processing and also drying wafers after ringing. It is also preferable that the tank comprise a lid and means to measure the chemical concentration of a processing liquid.

In another aspect, the invention is a method of processing wafers comprising: filling the process tank described above with wafer processing liquid through the tank inlet; submerging a wafer carrier holding a plurality of uprightly positioned wafers into the tank so that the diameter of the wafers are substantially perpendicular to the side walls; and applying megasonic energy to the liquid through the first and second transducer arrays for a predetermined time and in a predetermined pattern.

Preferably, the method further comprises continuously supplying the wafer processing liquid through the fluid inlet for a predetermined time after the wafers are submerged in the liquid filled tank so that the liquid overflows the side walls.

Also preferably, the method further comprises capturing the overflowed liquid in a weir and re-circulating the overflowed liquid back through the tank. The wafer processing liquid can be deionized water, hydrofluoric acid, ammonium hydroxide, hydrogen peroxide, hydrochloric acid, sulfuric acid, ozone, carbon dioxide, or a diluted variant of the aforementioned chemicals.

DETAIL DESCRIPTION OF THE DRAWINGS

Figure 1:
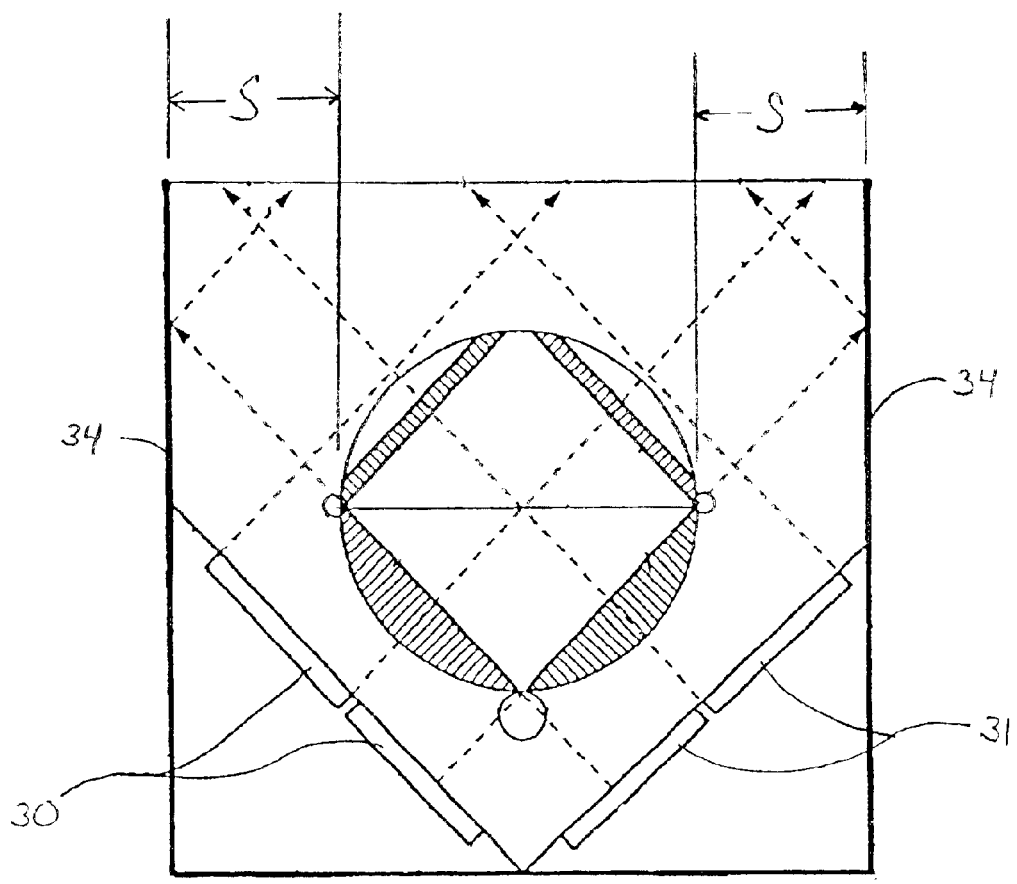
FIG. 1 is a prior art megasonic tank having transducers whose size and orientation necessitate an oversized processing chamber.
Figure 2:
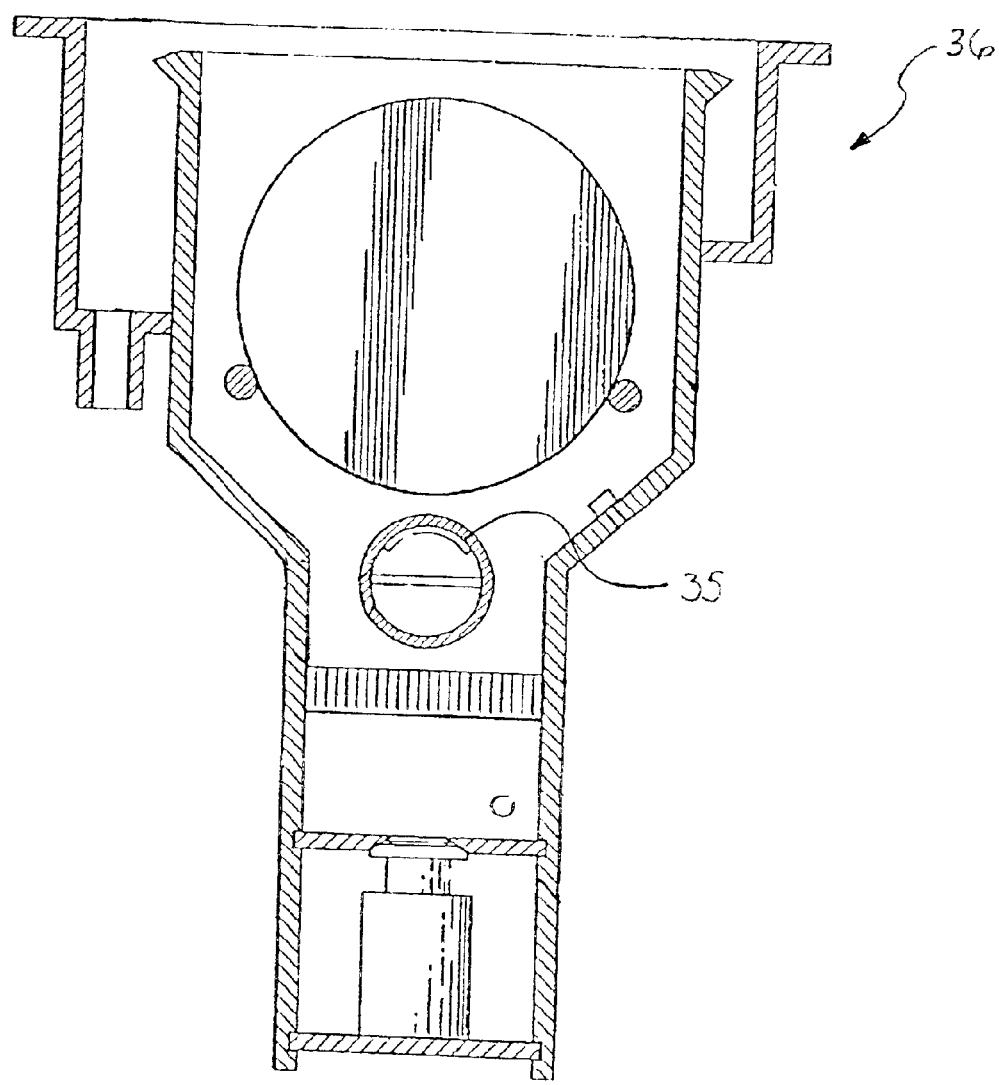
FIG. 2 is a prior art megasonic tank having a single transducer located at the bottom of the processing chamber.
Figure 3:
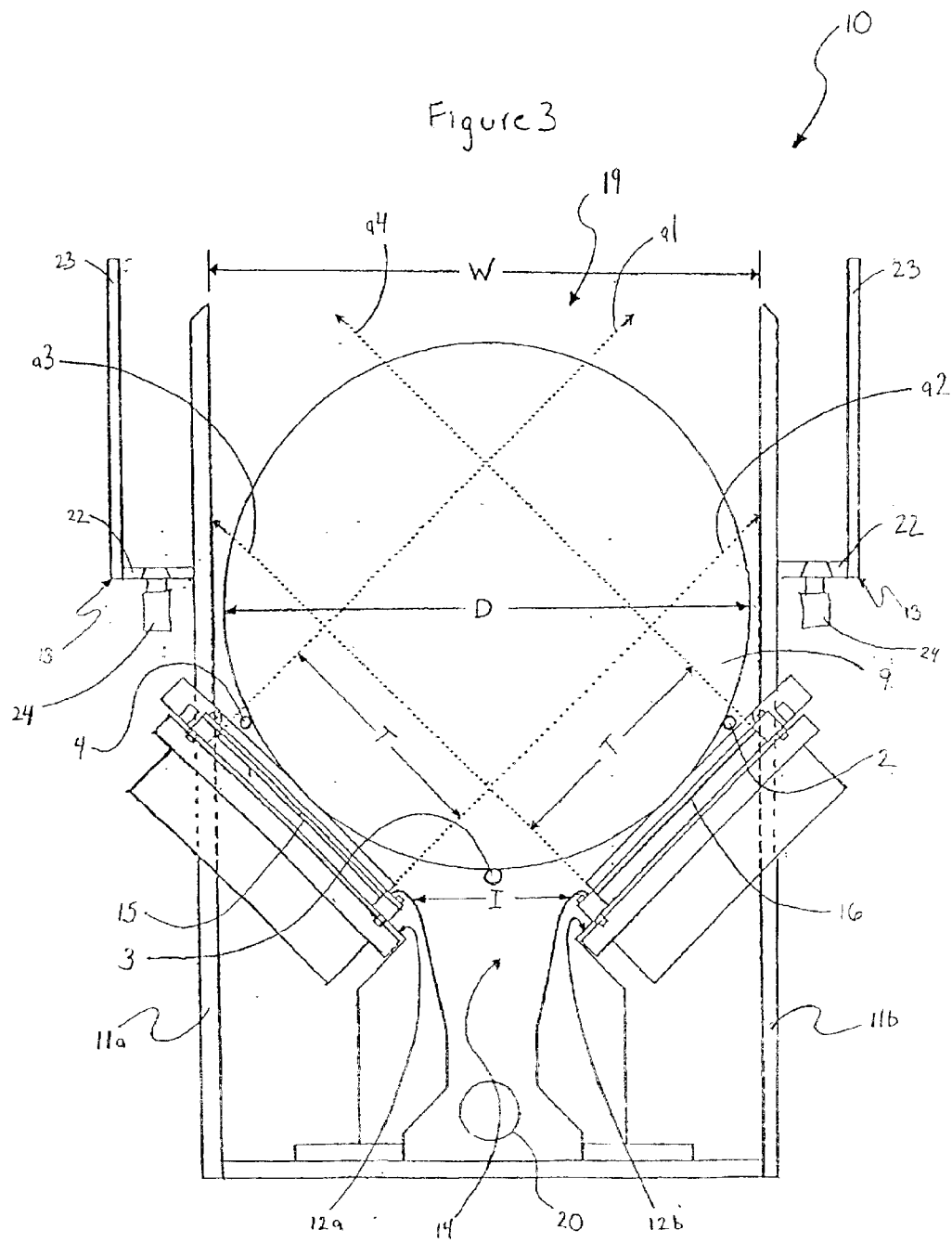
FIG. 3 is schematic cross-sectional view of the process tank of the present invention, a megasonic process tank having a reduced width processing chamber with a wafer placed therein.
Figure 4:
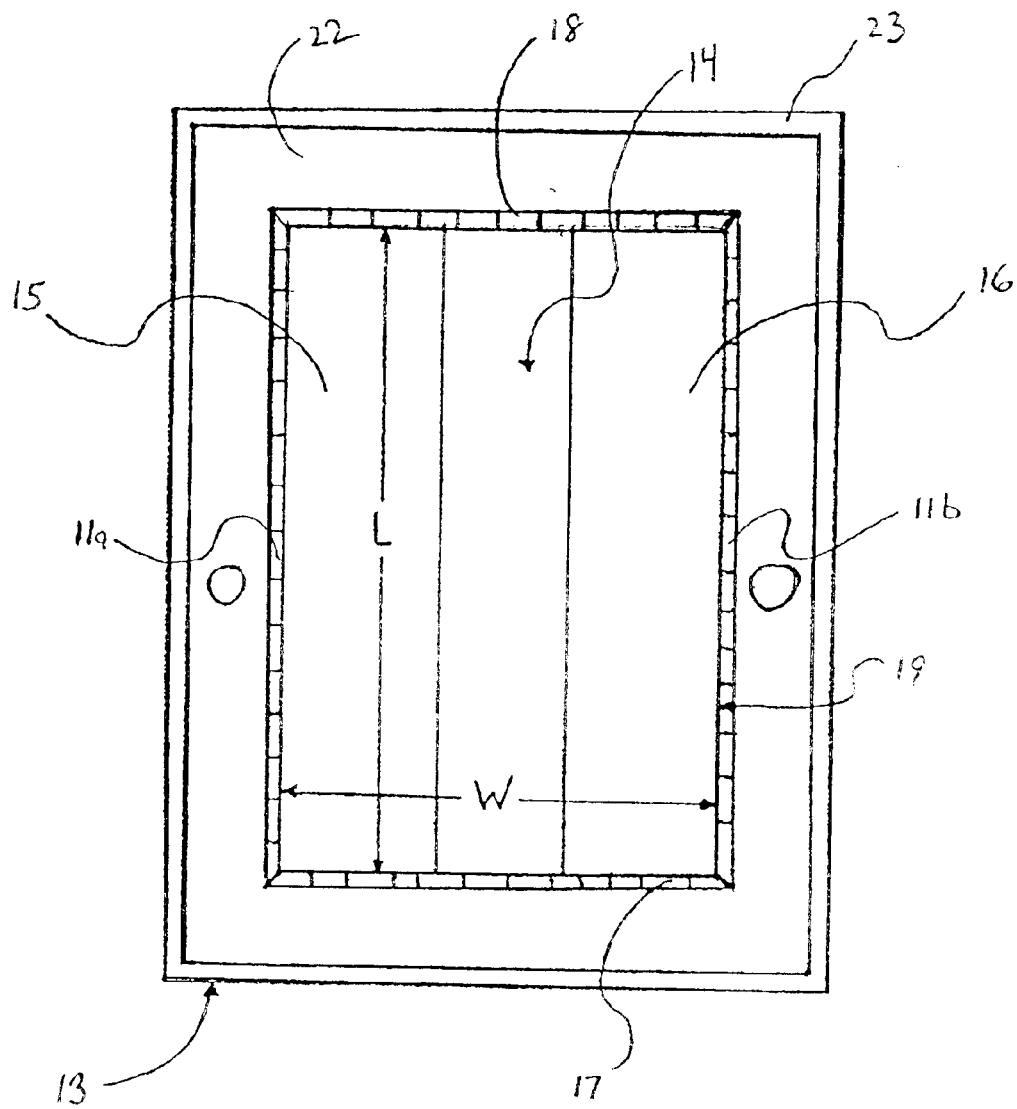
FIG. 4 is a top schematic view of the process tank of the present invention, a megasonic process tank having a reduced width processing chamber.

Referring to FIGS. 3 and 4, a process tank 10 configured in accordance with the present invention is illustrated. Tank 10 comprises substantially vertical side-walls 11a and 11b, two upwardly angled walls 12a and 12b, re-circulation weir 13, fluid inlet 14, first transducer 15, second transducer 16, front wall 17, and back wall 18.

Front wall 17 and back wall 18 oppose one another and are hermetically connected to opposite ends of side-walls 11a, 11b. As such, side-walls 11a, 11b, front wall 17, and back wall 18 form processing chamber 19. Processing chamber 19 is capable of receiving and holding wafer processing liquids through fluid inlet 14. Processing chamber 19 is adapted to receive a plurality of wafers 9. Side walls 11a, 11b, front wall 17, and back wall 18 can be constructed of PFA, PVDF, HDPE, or other material which is chemically compatible with and resistant to the processing fluids that are introduced into processing chamber 19.

Fluid inlet 14 is located at the bottom of processing chamber 19 and between the two upwardly angled walls 12a, 12b. Fluid inlet 14 has an hourglass side profile with one or more inlet holes 20 located at or near the bottom of inlet 14's hourglass profile. Inlet holes 20 are adapted to introduce various wafer processing liquids into inlet 14. After entering inlet 14, these liquids eventually flow into processing chamber 19. The combination of having an hourglass shaped profile and positioning inlet hole 20 at the bottom of this profile allows for good dispersion and reduced jetting of the liquid when it enters processing chamber 19. Moreover, it is preferable that processing fluid enter through inlet hole 20 with a uniform flow profile. Additionally, the width I of the top of inlet 14 is approximately one-fourth the diameter D of the wafers 9 being processed in processing chamber 19. These design features of inlet 14 balance the competing needs of even flow distribution across the length of a wafer stack positioned in processing chamber 19 and a uniform velocity profile of the liquid entering process chamber 19.

Side walls 11a and 11b are substantially vertical and separated by a distance W which defines the width of processing chamber 19. Distance W is substantially equal to the diameter D of the wafers 9 to be processed in process tank 10. This eliminates the space between the wafer edges and the walls of the tanks that exists in prior art process tanks. By making distance W substantially equal to wafer diameter D, substantially all of the processing liquid that enters processing chamber 19 via inlet 14 will now pass by the surface of the wafers 9. This results in both increased particle removal from the surface of the wafers 9 and increased flow uniformity across surfaces of the wafers 9.

Increased particle removal occurs because the increased flow of fluid between the surfaces of wafers 9 results in more particles being removed and/or carried away by the fluid. For example, suppose process tank 10 is utilizing an overflow method of cleaning and has a plurality of wafers 9 (i.e. a wafer stack) positioned in processing chamber 19 as illustrated in FIG. 3. In utilizing the overflow method of cleaning, liquid enters inlet 14 through inlet hole 20. The liquid is continuously supplied until the liquid fills processing chamber 19 and is overflowing walls 11a, 11b, 17, and 18. As long as liquid is supplied to process tank 10, clean liquid constantly enters process chamber 19 at inlet 14, flows upward passed the surface of wafers 9, and exits processing chamber 19 by overflowing the walls 11a, 11b, 17, and 18. As the clean liquid passes by the surfaces of the wafers 9, contaminants both on and near the surface of the wafer 9 are carried away by the passing liquid and eventually exit processing chamber 19. Thus, increasing the amount of liquid that passes by the surfaces of the wafers 9 results in an increase in the amount of contaminants being carried away by the fluid. As such, increased wafer cleanliness is achieved, increasing the output of properly functioning devices per wafer 9.

As mentioned above, increased flow uniformity across the surfaces of the wafers 9 is another benefit achieved by ensuring that distance W is substantially equal to wafer diameter D. Increased flow uniformity is especially beneficial when process tank 10 is being used to perform the chemical etching step of manufacturing wafers. Increased flow uniformity is important in chemical etching because it results in a uniform etch rate across the entire surface of each wafer 9. A non-uniform etch rate results in the material to be stripped off the wafer surface being stripped in uneven amounts across the wafer surface. As a result, many devices on the wafer 9 will be etched too much or too little, resulting in failed devices. Thus, this increased flow uniformity will achieve uniform etch rates, and in turn an increase in the output of properly functioning devices per wafer 9.

An additional way to ensure that substantially all of the processing liquid that enters processing chamber 19 passes between the wafers 9 is by designing process tank 10 so that the distance L between front wall 17 and back wall 18 is substantially equal to the length of the wafer stack to be processed.

Figure 5:
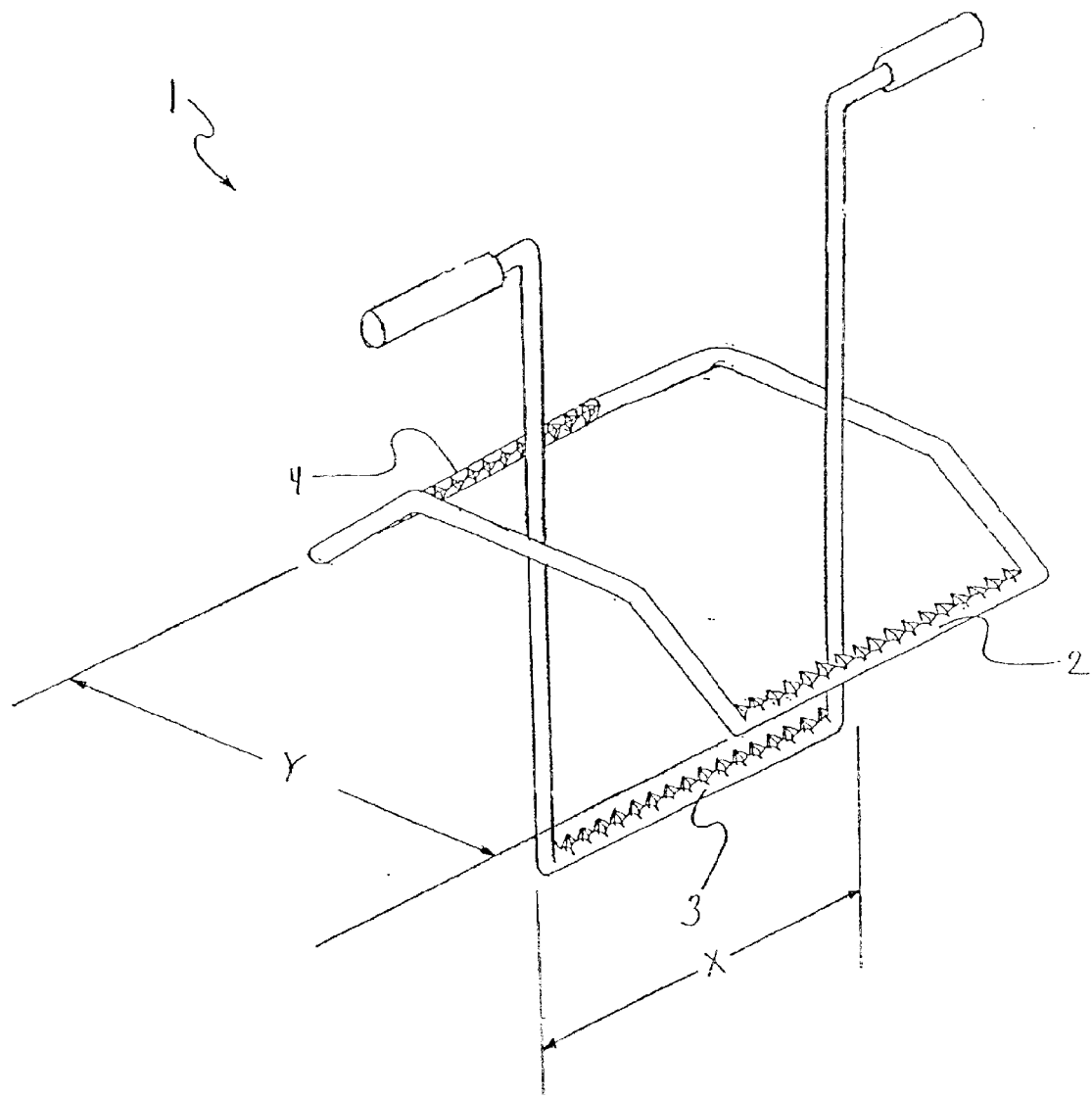
FIG. 5 is perspective view of a wafer carrier capable of lowering a stack of wafers into the process tank of the present invention.

Referring to FIG. 5, one way this can be done is to design process tank 10 so that distance L is substantially equal to the length X of the wafer carrier 1 that will support the plurality of wafers 9 in processing chamber 19. Preferably, wafer carrier 1 maintains wafers 9 in an upright position (i.e. vertical) and is designed to have a width Y that is less than the diameter D of the wafers 9. Moreover, wafer support members 2, 3, 4 of wafer carrier 1 should be as small as possible so as to minimize the obstruction of fluid flow and the obstruction of the megasonic energy. It is also preferable that wafer carrier 1 be loaded to capacity with wafers 9 because a wafer stack with missing wafers will experience degradation of flow uniformity. Once wafer carrier 1 is fully loaded with wafers 9 in an upright position, loaded wafer carrier 1 is lowered into processing chamber 19 of process tank 10 until the wafers 9 are in the position shown in FIG. 3. In the fully lowered position, the edges of wafers 9 should nearly contact first and second transducer arrays 15, 16 when the top edge of wafer 9 is just below the top of side walls 11a, 11b. Wafer support member 2, 3, 4 are designed to support wafers 9 with minimal contact. The wafer carrier shown in FIG. 5 is the subject of a pending U.S. patent application, Ser. No. not yet assigned.

Referring back to FIG. 3, process tank 10 further comprises upwardly angled walls 12a and 12b. In the illustrated embodiment, walls 12a and 12b are at an angle 45 degrees from the horizontal. First transducer array 15 is connected to the upper surface of upwardly angles wall 12a while second transducer array 16 is connected to the upper surface of upwardly angled wall 12b. By attaching transducer arrays 15, 16 to the upper surface of angled walls 12a, 12b, the transducers are in direct contact with the processing liquid contained in processing chamber 19. As such, sonic energy can be more efficiently transferred to the liquid. Transducer arrays 15, 16 are respectively sealed to upwardly extended walls 12a, 12b through the use of O-rings (not shown). This provides a tight hermetic seal.

First and second transducer arrays 15, 16 are of length T. In order to maintain distance W substantially equal to the diameter D of wafer 9, length T must be less than the diameter D of wafer 9. In the illustrated embodiment, length T is designed to be approximately one-half the diameter D of wafer 9. As a result of length L being less than diameter D of wafer 9, the entire surface of wafer 9 is not exposed to direct sonic energy emitted by transducer arrays 15, 16. Only that surface area of wafer 9 between lines a1 and a2 and between lines a3 and a4 is exposed to direct sonic energy (less that area shielded by the wafer support elements 2, 3, 4). As such, portions of wafer 9 are not exposed to direct coverage. Despite prior art teachings that direct coverage of the entire wafer surface is necessary in order to have adequate megasonic cleaning, the positioning and size of transducer arrays 15, 16 as shown in FIG. 3 provides high particle removal efficiency over the entire surface of wafer 9. Applicant believes that the entire surface of wafer 9 is cleaned by a combination of direct and reflected sonic energy. As such, the length L of transducer arrays 15, 16 can be in the range of one-fourth to three-fourths the diameter D of wafer 9 and still provide adequate sonic energy to the entire surface of the wafers 9.

Additionally, both first and second transducer arrays 15, 16 are composite constructions having a rigid matching plane which provides a mounting surface for the piezoelectric material on the underside, and also a protective coating on the side exposed to processing chamber 19. The preferred coating is a flouropolymer film that is treated on one side and bonded to the matching plane. This provides a strong mechanical/chemical bond which allows for efficient transfer of acoustic energy through the cover material. The coating could also be PFA directly bonded to the matching plane, or left bare for use with solvents. Transducer arrays 15, 16 are designed to be capable of providing megasonic energy in the range of 0.5 to 2.0 megahertz.

Finally, transducer arrays, 15, 16 are electrically connected to an electrical energy source and a controller. A such, megasonic energy can be pulsed by the transducer arrays 15, 16, so as to provide better cleaning efficiencies. Also, the controller allows the user to adjust the pulse length to optimize cleaning abilities. Pulse length can vary from 10 to 9999 milliseconds. Pulsed energy provides maximum cleaning efficiencies while providing coolest operation conditions by not having all crystals powered at the same time.

Referring again to FIGS. 3 and 4, re-circulation weir 13 surrounds walls 11a, 11b, 17, 18 and comprises basin floor 22 and outer basin wall 23. Re-circulation weir 13 enables process tank 10 to capture overflowing liquid and re-circulate this liquid through processing area 19 through fluid connections (not illustrated) if desired. As such, re-circulation weir 13 conserves the amount of processing fluids used by process tank 10. Re-circulation weir 13 further comprises one or more quick dump valves 24 located on basin floor 22. Quick dump valves 24 are fluidly connected to a re-circulation system for re-circulating the overflowed fluid into processing area 19 if desired. Moreover, quick dump valves 24 also allow process tank 20 to be used for process steps having high flow rate requirements.

It will be understood to those in the art that process tank 10 can be used to perform a variety of wafers processing steps, including chemical etching, photo-resist stripping, cleaning, and drying. These different processing steps can be achieved by altering the identity of the processing liquids being introduced through fluid inlet 14 and by altering the gases being introduced into the process tank 10. These processing fluids and gases can be deionized water, hydrofluoric acid, ammonium hydroxide, hydrogen peroxide, hydrochloric acid, ozone, carbon dioxide, or any diluted variant or combination of the aforementioned chemicals. Moreover, process tank 10 is capable of performing multiple wafer processing steps without removing the wafers from processing chamber 19. Such capabilities are simply a matter of providing proper control equipment, proper fluid supply connections, and multiple fluid reservoirs.

The foregoing discussion discloses and describes merely exemplary embodiments of the present invention. As will be understood by those skilled in this art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A process tank for processing a plurality of wafers having a diameter, the process tank comprising:

two substantially vertical side walls being a first distance apart;

wherein the first distance is substantially equal to the diameter of the wafer;

two upwardly angled walls positioned between the side walls;

a first transducer array coupled to a first of the upwardly angled walls, the first transducer array extending a length less than the diameter of the wafer; and a second transducer array coupled to a second of the upwardly angled walls, the second transducer array extending a length less than the diameter of the wafer.

2. The tank of claim 1 comprising a fluid inlet positioned between the upwardly angled walls.

3. The tank of claim 2 wherein the inlet is approximately one-fourth the diameter of the wafer.

4. The tank of claim 2 wherein the inlet is has an hourglass-shaped side profile.

5. The tank of claim 1 wherein neither the first nor second transducer arrays, individually or in combination with one another, provide direct megasonic energy to the entire surface area of wafers placed in the tank.

6. The tank of claim 1 wherein the lengths of the first and second transducer arrays are within the range of one-fourth to three-fourths the diameter of the wafers.

7. The tank of claim 1 wherein the lengths of the first and second transducer arrays are about ½ the diameter of the wafer.

8. The tank of claim 1 wherein the first and second upwardly angled walls are 45 degrees from horizontal.

9. The tank of claim 8 wherein the lengths of the first and second transducer arrays are about ½ the diameter of the wafer.

10. The tank of claim 1 wherein the two upwardly angled walls and the first and second transducer arrays are substantially linear.

11. The tank of claim 1 wherein the upwardly angled walls are positioned between the side walls at a height so that when a wafer is uprightly positioned in the tank so that the top of the wafer is just below the top of the side walls, the wafers nearly contact the first and second transducer surfaces.

12. The tank of claim 11 wherein the wafers are within 0.1–1 inch of the first and second transducer surfaces.

13. The tank of claim 1 comprising a re-circulation loop.

14. The tank of claim 13 wherein the re-circulation loop comprises a weir and at least one quick dump valve.

15. The tank of claim 1 wherein the first and second transducer arrays are respectively connected to the upper surface of the first and second upwardly angled walls.

16. The tank of claim 1 comprising substantially vertical back and front walls being a second distance apart wherein the second distance is substantially equal to length of a wafer carrier adapted to carry a plurality of wafers.

17. The tank of claim 1 wherein the tank is adapted for rinsing wafers after chemical processing and also drying wafers after rinsing.

18. The tank of claim 1 comprising means to measure the chemical concentration of a processing liquid.

19. The tank of claim 1 comprising a lid.

20. A method of processing wafers comprising:

filling the tank of claim 2 with a wafer processing liquid through the tank inlet;

submerging a wafer carrier holding a plurality wafers into the tank; and applying megasonic energy to the liquid through the first and second transducer arrays for a predetermined time and in a predetermined pattern.

21. The method of claim 20 wherein the plurality of wafers are uprightly positioned in the wafer carrier and the wafer carrier is submerged so that the diameter of the wafers are substantially perpendicular to the side walls.

22. The method of claim 20 comprising continuously supplying the wafer processing liquid through the inlet for a predetermined time after the wafers are submerged in the liquid filled tank so that the liquid overflows the side walls.

23. The method of claim 20 comprising capturing the overflowed liquid and recirculating the overflowed liquid back through the tank via pump, filters, heater, concentration sensors.

24. The method of claim 20 wherein the wafer processing liquid is deionized water, hydrofluoric acid, ammonium hydroxide, hydrogen peroxide, hydrochloric acid, sulfuric acid, ozone, carbon dioxide, or a combination thereof.

* * * * *